(12) United States Patent
Chen et al.

(10) Patent No.: US 7,341,930 B2
(45) Date of Patent: Mar. 11, 2008

(54) SYSTEMS AND METHODS FOR INTEGRATION OF HETEROGENEOUS CIRCUIT DEVICES

(75) Inventors: Jingkuang Chen, Rochester, NY (US); Yi Su, Portland, OR (US)

(73) Assignee: Xerox Corporation, Norwalk, CT (US)

( * ) Notice: Subject to any disclaimer, the term of this patent is extended or adjusted under 35 U.S.C. 154(b) by 274 days.

(21) Appl. No.: 10/990,711

(22) Filed: Nov. 17, 2004

(65) Prior Publication Data

US 2005/0095790 A1 May 5, 2005

Related U.S. Application Data

(62) Division of application No. 09/683,857, filed on Feb. 22, 2002, now Pat. No. 6,861,341.

(51) Int. Cl.
*H01L 21/00* (2006.01)

(52) U.S. Cl. ............ 438/527; 438/52; 438/275

(58) Field of Classification Search ........ 438/527, 438/52, 275
See application file for complete search history.

(56) References Cited

U.S. PATENT DOCUMENTS

| | | | |
|---|---|---|---|
| 4,697,332 A | 10/1987 | Joy et al. | |
| 5,242,841 A | 9/1993 | Smayling et al. | 438/275 |
| 5,360,748 A * | 11/1994 | Nadahara et al. | 438/476 |
| 5,360,987 A | 11/1994 | Shibib | |
| 5,498,554 A | 3/1996 | Mei | 438/200 |
| 5,519,247 A | 5/1996 | Arbus et al. | 257/437 |
| 5,844,264 A | 12/1998 | Shinji | 257/223 |
| 5,933,731 A | 8/1999 | Tanimoto et al. | 438/258 |
| 5,994,740 A | 11/1999 | Nakagawa et al. | |
| 6,090,652 A | 7/2000 | Kim | 438/228 |
| 6,111,305 A | 8/2000 | Yoshida et al. | |
| 6,121,552 A | 9/2000 | Brosnihan et al. | |
| 6,127,213 A | 10/2000 | Tung | |
| 6,130,458 A | 10/2000 | Takagi et al. | 257/351 |
| 6,207,510 B1 | 3/2001 | Abeln et al. | 438/276 |
| 6,214,674 B1 | 4/2001 | Tung | |
| 6,258,701 B1 | 7/2001 | Depetro et al. | 438/499 |

(Continued)

FOREIGN PATENT DOCUMENTS

EP  1 067 600 A1  1/2001

(Continued)

OTHER PUBLICATIONS

Quirk et al., Semiconductor Manufacturing Technology (2001), Prentice Hall, pp. 228, 229 and 348.

*Primary Examiner*—Laura M. Schillinger
(74) *Attorney, Agent, or Firm*—Oliff & Berridge, PLC

(57) ABSTRACT

A heterogeneous device comprises a substrate and a plurality of heterogeneous circuit devices defined in the substrate. In embodiments, a plurality of heterogeneous circuit devices are integrated by successively masking and ion implanting the substrate. The heterogeneous device may further comprise at least one microelectromechanical system-based element and/or at least one photodiode. In embodiments, the heterogeneous circuit devices comprise at least one CMOS transistor and at least one DMOS transistor. In embodiments, the substrate comprises a layer of silicon or a layer of p-type silicon. In other embodiments, the substrate comprises a silicon-on-insulator wafer comprising a single-crystal-silicon layer or a single-crystal-P-silicon layer, a substrate and an insulator layer therebetween.

9 Claims, 32 Drawing Sheets

U.S. PATENT DOCUMENTS

Figure 1:
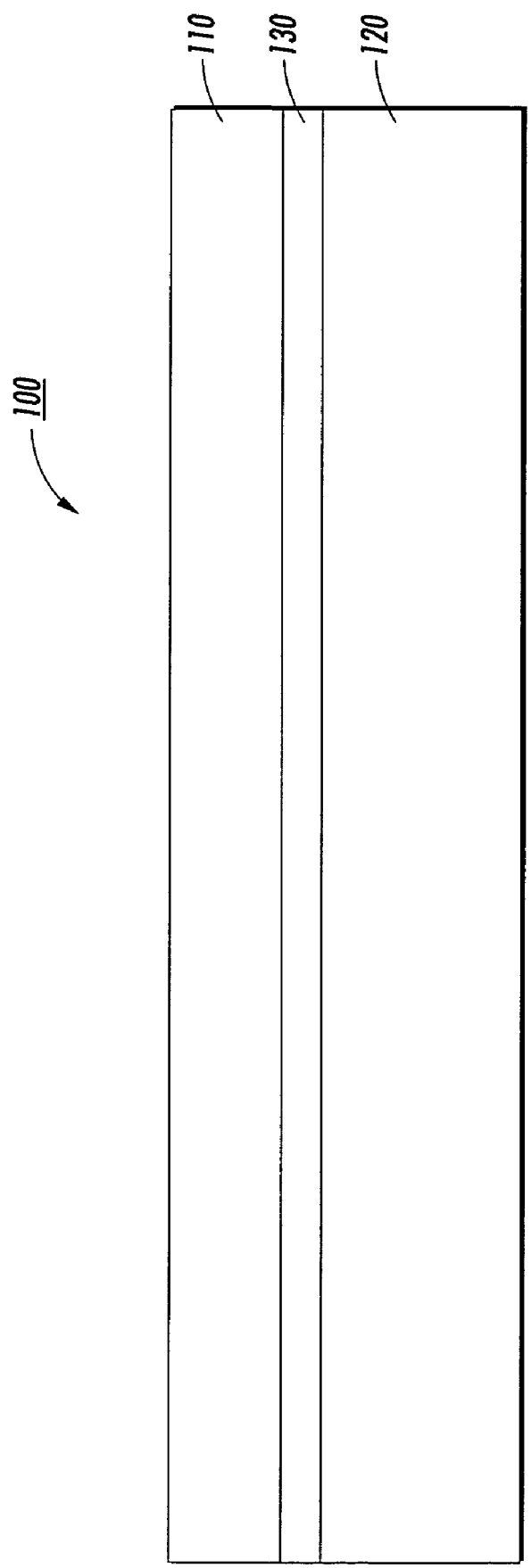

| | | | |
|---|---|---|---|
| 6,444,487 B1 | 9/2002 | Boggs et al. | 438/48 |
| 6,580,138 B1 | 6/2003 | Kubena et al. | 257/415 |
| 6,642,076 B1 | 11/2003 | Yaung et al. | |
| 6,686,233 B2 | 2/2004 | Soderbarg et al. | 438/217 |
| 6,713,347 B2 | 3/2004 | Cappelletti et al. | 438/257 |
| 6,861,341 B2* | 3/2005 | Chen et al. | 438/527 |
| 7,122,449 B2* | 10/2006 | Langdo et al. | 438/481 |
| 7,160,752 B2* | 1/2007 | Ouellet et al. | 438/52 |
| 2001/0046756 A1 | 11/2001 | Helm | |
| 2001/0052628 A1 | 12/2001 | Ishio et al. | |
| 2003/0162375 A1* | 8/2003 | Chen et al. | 438/527 |
| 2004/0075110 A1 | 4/2004 | Yaung et al. | |
| 2004/0084745 A1* | 5/2004 | Chen et al. | 257/499 |
| 2004/0157426 A1* | 8/2004 | Ouellet et al. | 438/618 |
| 2005/0095790 A1* | 5/2005 | Chen et al. | 438/275 |
| 2006/0166403 A1* | 7/2006 | Ouellet et al. | 438/109 |

FOREIGN PATENT DOCUMENTS

| | | |
|---|---|---|
| EP | 1 150 356 A1 | 10/2001 |
| JP | 09-064193 | 8/1995 |
| WO | WO 00/65662 | 11/2000 |
| WO | WO 02/12116 A2 | 2/2002 |

* cited by examiner

SYSTEMS AND METHODS FOR INTEGRATION OF HETEROGENEOUS CIRCUIT DEVICES

CROSS REFERENCE TO RELATED APPLICATIONS

This is a divisional of U.S. application Ser. No. 09/683,857; filed Feb. 22, 2002 now U.S. Pat. No. 6,861,341 by the same inventors, and claims priority therefrom. This divisional application is being filed in response to a restriction requirement in that prior application.

This invention relates to heterogeneous devices comprising a plurality of heterogeneous circuit devices and methods for fabricating a plurality of such devices heterogeneous circuit devices in a single substrate.

Systems are known that employ multiple different or heterogeneous devices. For example, a microelectromechanical system (MEMS)-based optical communication system may employ various electronic and optical devices, including circuits/devices such as complementary metal oxide semiconductor (CMOS) circuits, photodiodes, double-diffused metal oxide semiconductor (DMOS) transistors, bipolar transistors and the like, to implement various functions.

In such systems, each of the heterogeneous devices are fabricated on separate chips using different processes. The fabricated devices are then combined to form various components of the overall system. For example, in optical telecommunications systems, various heterogeneous integrated circuit chips, such as photodiodes, complementary metal oxide semiconductor (CMOS) signal processing circuits and high voltage drivers, are wire bonded into the optical system to achieve signal conversion/processing functions and mechanical control functions, such as mechanical switching.

The conventional approaches to combining heterogeneous devices require additional time and expense for accurate bonding of the separate chips and result in relatively bulky components. These bonding/assembling processes also introduce noises into the system. In addition to the actual combining process, separate processes are required for each different device, resulting in high costs and long processing times.

The systems and methods according to this invention provide more efficient fabrication of devices that are formed by a combination of multiple heterogeneous devices.

The systems and methods according to this invention separately provide reduced costs for fabrication of devices that are formed by a combination of multiple heterogeneous devices.

The systems and methods according to this invention separately provide reduced size for devices that are formed by a combination of multiple heterogeneous devices.

The systems and methods according to this invention separately provide more accurate fabrication of devices that are formed by a combination of multiple heterogeneous devices.

The systems and methods according to this invention can therefore achieve better signal-to-noise ratio and higher reliability and accuracy.

The systems and methods according to this invention separately provide integration of a plurality of heterogeneous devices in a single substrate.

The systems and methods according to this invention separately provide integration in a single substrate of a device having a high voltage well and a device having a low voltage well.

The systems and methods according to this invention separately provide integration of a plurality of heterogeneous devices and a micro-electromechanical system-based element in a single substrate.

In various exemplary embodiments of the devices according to this invention, a heterogeneous device comprises a substrate and a plurality of heterogeneous circuit devices defined in the substrate. The heterogeneous device may further comprise at least one microelectromechanical system-based element and/or at least one photodiode. In various exemplary embodiments, the heterogeneous circuit devices comprise at least one CMOS transistor and at least one DMOS transistor.

In various exemplary embodiments, the substrate comprises a bulk p-type silicon or a silicon-on-insulator) structure with a p-type single-crystalline-silicon layer on the top.

According to various exemplary embodiments of the methods of this invention, a heterogeneous device is fabricated by: providing a substrate; and successively masking and ion implanting the substrate to define a plurality of heterogeneous circuit devices in the substrate. In various embodiments, at least one microelectromechanical system-based element is formed in the substrate. In various embodiments, at least one photodiode is ion formed in the substrate. In various embodiments, at least one complementary metal oxide semiconductor (CMOS) transistor and at least one double-diffused metal oxide semiconductor (DMOS) transistor are ion implanted in the substrate.

According to various exemplary embodiments of the methods of this invention, a fabrication method for integrating a plurality of heterogeneous circuit devices in a single substrate comprises: providing a substrate; forming a first protective layer over the substrate; removing a portion of the first protective layer; ion implanting a high voltage well of a first circuit device in the substrate using the partially removed first protective layer; forming a second protective layer over the substrate; removing a portion of the second protective layer; and ion implanting a first low voltage well of a second circuit device in the substrate using the partially removed second protective layer.

In various embodiments, a third protective layer is formed over the substrate. A portion of the third protective layer is removed and a second low voltage well of the second circuit device is ion implanted in the substrate. In various embodiments, a field oxide layer is formed over at least part of each of the high voltage well, the first low voltage well and the second low voltage well. In various embodiments, the substrate is ion implanted to adjust the threshold of different transistor devices.

In various embodiments, a polysilicon layer is formed over the oxide layer. A portion of the polysilicon layer is removed to define a polysilicon gate for each of the high voltage device, the first low voltage device and the second low voltage device.

In various embodiments, a fourth protective layer is formed over at least the oxide layer and the polysilicon gates. A portion of the fourth protective layer is removed and a P-body is implanted in the high voltage well of the first circuit device using the partially removed fourth protective layer.

In various embodiments, a fifth protective layer over at least the oxide layer and the polysilicon gates. A portion of the fifth protective layer is removed and at least one N+ source/drain is ion implanted in the P-body, in the high voltage well and in the first low voltage well of the second circuit device using the partially removed fifth protective layer.

In various embodiments, a sixth protective layer is formed over at least the oxide layer and the polysilicon gates. A portion of the sixth protective layer is removed and at least one P+ source/drain is ion implanted in the P-body and in the second low voltage well of the second circuit device using the partially removed sixth protective layer.

In various embodiments, a passivation oxide layer is formed over at least the oxide layer and the polysilicon gates. A plurality of vias may be formed through the passivation oxide layer to each of the N+ and P+ sources/drains. In such embodiments, a layer of metal is formed over the passivation oxide layer and in the vias. A portion of the layer of metal over the passivation oxide layer is removed to define a plurality of electrical interconnects.

These and other features and advantages of this invention are described in, or are apparent from, the following detailed description of various exemplary embodiments of the systems and methods according to this invention.

Various exemplary embodiments of the systems and methods of this invention described in detail below, with reference to the attached drawing figures, in which:

FIG. 1 is a cross-sectional view of a silicon-on-insulator wafer used to fabricate, according to an exemplary embodiment of the invention, a device comprising a plurality of heterogeneous devices; and FIGS. 2-32 are cross-sectional views illustrating an exemplary method of fabricating, according to the invention, a device comprising a plurality of heterogeneous devices.

This invention provides integration of heterogeneous circuit devices in a single substrate. According to this invention, a heterogeneous device comprises a substrate and a plurality of heterogeneous circuit devices defined in the substrate. The heterogeneous device may further comprise at least one microelectromechanical system-based element and/or at least one photodiode. The heterogeneous circuit devices may comprise a CMOS transistor and a DMOS transistor.

By integrating a plurality of the heterogeneous circuit devices in a single substrate, the overall size of a given component is reduced. Further, since separate chip are not bonded together to form the heterogeneous device, potential problems with accuracy and noises are reduced or even eliminated. Costs are further reduced by eliminating the need for separate processes for each of the different circuit devices and eliminating the combining process.

According to various exemplary embodiments of this invention, integrated-circuit-based manufacturing techniques are used to fabricate the heterogeneous devices and this integration can be extended to include surface and/or bulk micromachined devices on the same substrate. Such manufacturing technologies are relatively advanced compared to other potential technologies, yielding more reliable results and greater flexibility.

FIGS. 1-32 illustrate various steps of an exemplary embodiment of a method according to this invention. It should be understood that conventional processing techniques, such as prefurnace cleaning, and details that would be apparent to one of ordinary skill in the art, such as the use of monitor wafers, are omitted from the description of the exemplary embodiment for the sake of brevity. Also, unless important to this invention, specific details such as furnace treatments and etching times are omitted since various parameters may be employed without departing from this invention. Unless otherwise specified, the details provided are approximate ranges and reasonable modifications are contemplated.

Figure 32:
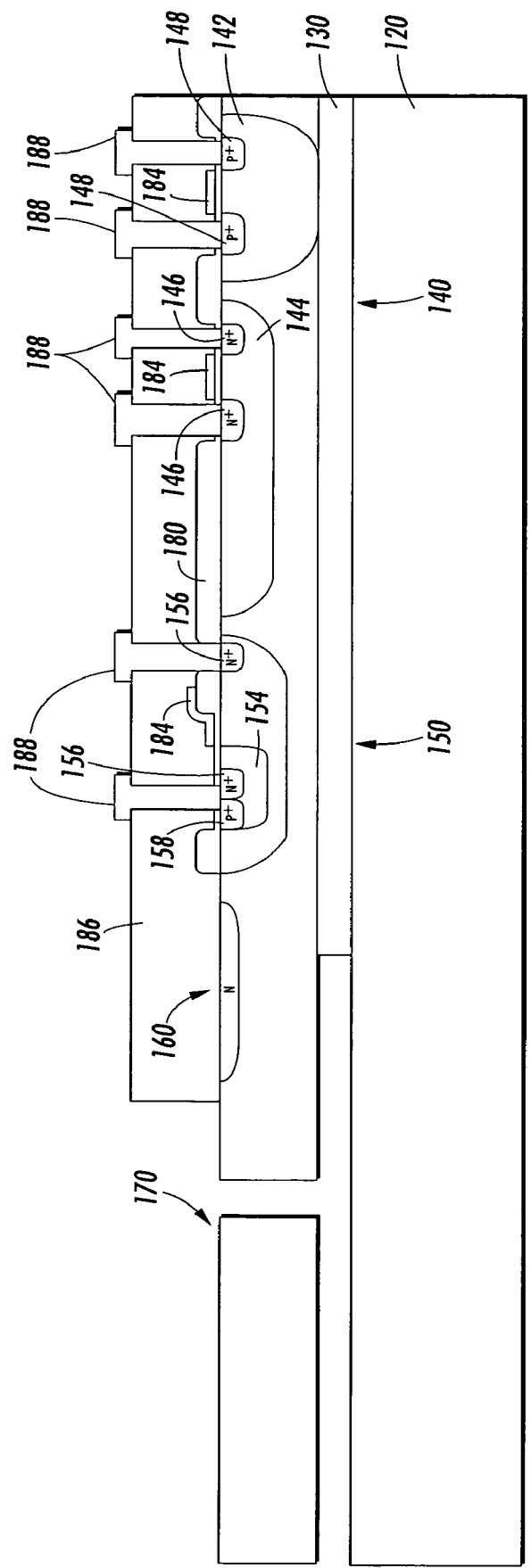

As shown in FIG. 1, the process of the exemplary embodiment begins with a silicon-on-insulator (SOI) wafer 100, although the same embodiment can be implemented on a bulk silicon substrate as well. The silicon-on-insulator wafer 100 comprises a single-crystal-silicon (SCS) layer 110, a silicon substrate 120 and an insulator layer 130 therebetween. The single-crystal-silicon (SCS) layer 110 may be, for example, 5 microns thick. Also, the single-crystal-silicon (SCS) layer 110 and the silicon substrate 120 may be doped, for example with boron, to form p-type silicon, depending on the desired heterogeneous device. As shown in FIG. 32, the exemplary fabrication process provides a CMOS transistor 140, a DMOS transistor 150, a photodiode 160 and a microelectromechanical system-based element 160 in the single-crystal-silicon (SCS) layer 110.

Figure 2:
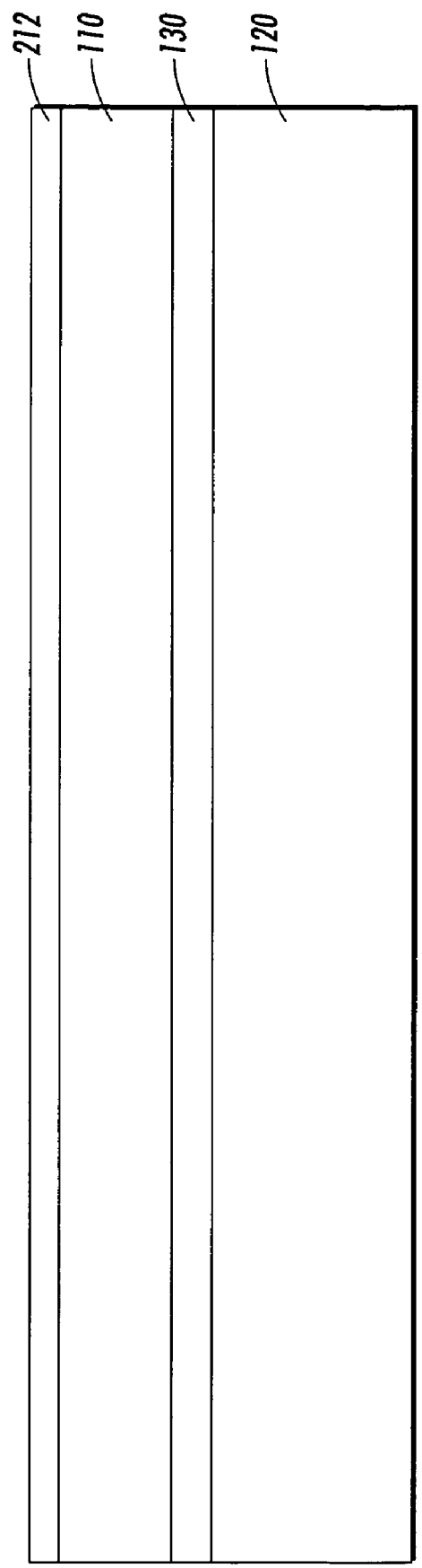

As shown in FIG. 2, a first protective layer 212 of greater than about 7000 angstroms is formed over the single-crystal-silicon layer 110. The first protective layer 212 may be an oxide, either grown in a wet steam or in a dry oxygen ambient. However, it should be understood that, unless otherwise specified, any suitable process, either known or hereafter developed, may be used to form a protective layer and any suitable material, either known or hereafter developed, such as, for example, silicon nitride, may be used for a protective layer.

Figure 3:
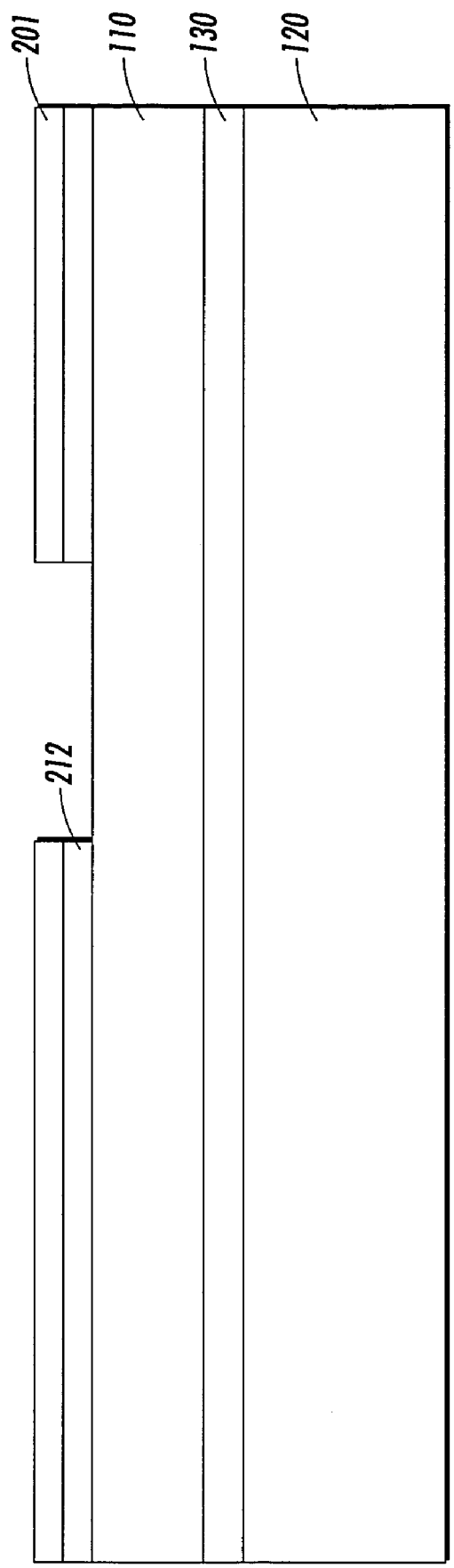

As shown in FIG. 3, a first mask 201 is formed over the first protective layer 212. The first mask 201 may be, for example, a photoresist that is formed by any suitable photolithography process, either known or hereafter developed. Using the first mask 201, a portion of the first protective layer 212 is removed, for example, by etching. Any suitable wet or dry etching technique, either known or hereafter developed, may be used. Further, any suitable etchant, such as a hydrofluoric acid etchant, may be used for the given material of the first protective layer 212.

Figure 4:
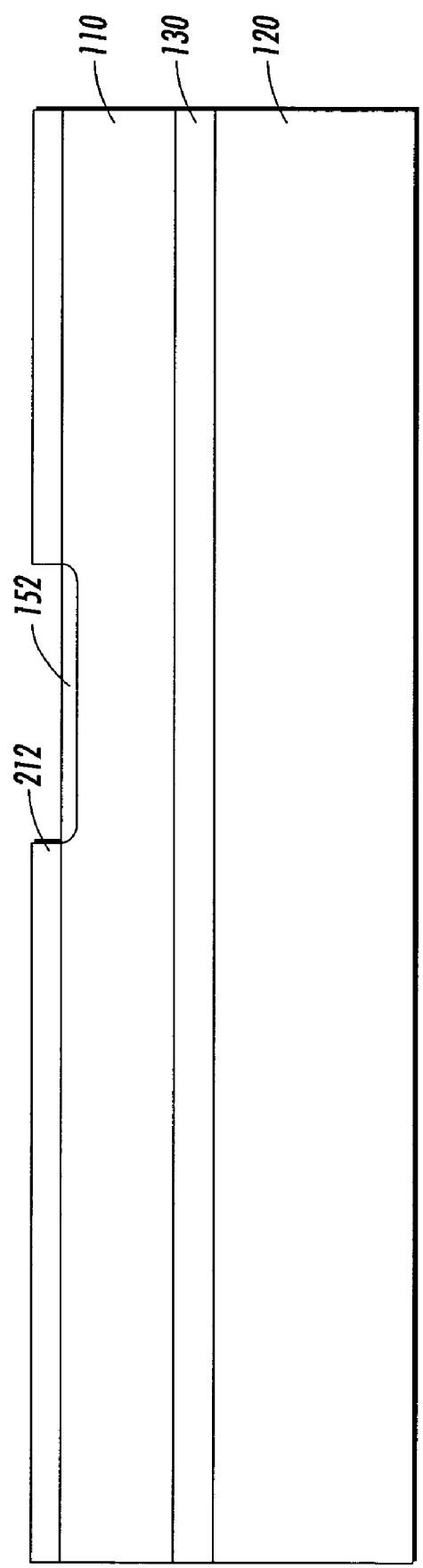

With the first mask 201 in place, a high voltage n-well 152 of the DMOS transistor 150 is ion implanted in the single-crystal-silicon layer 110. The ion implantation of the high voltage n-well 152 may be accomplished using any suitable implantation technique, either known or hereafter developed. As shown in FIG. 4, the first mask 201 is then removed or stripped using any suitable method, either known or hereafter developed.

Figure 5:
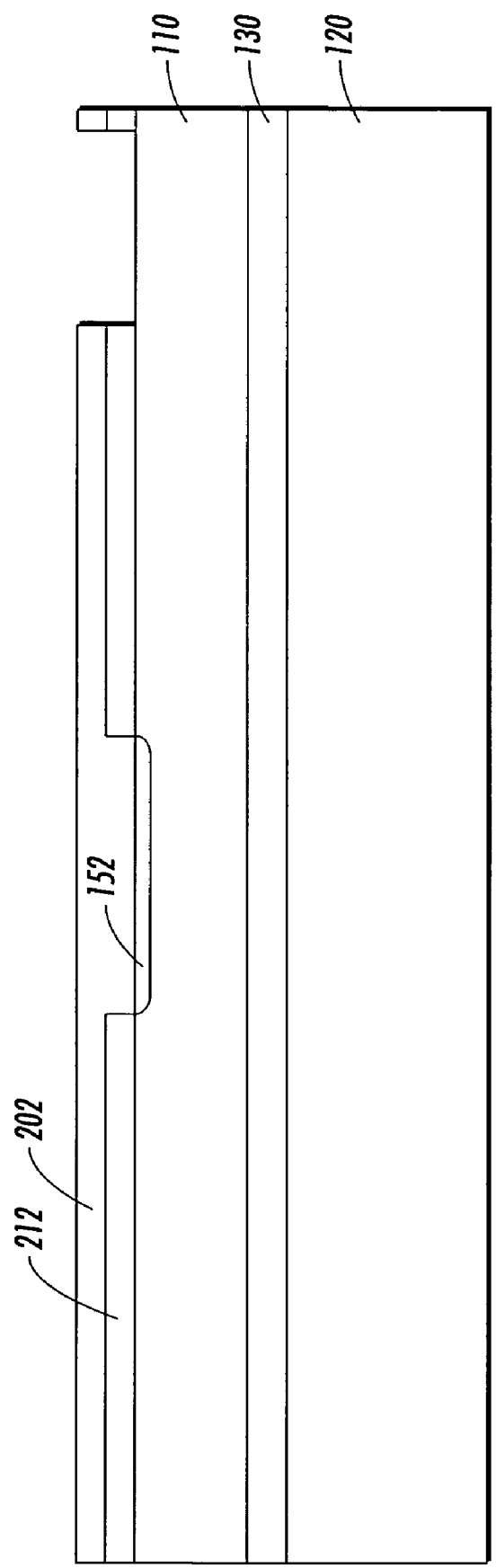

As shown in FIG. 5, a second mask 202 is formed over the first protective layer 212 and the high voltage n-well 152. Using the second mask 202, a portion of the first protective layer 212 is removed, for example, by etching. As described below, the second mask 202 also serves as a protective layer for the high voltage n-well 152 during ion implantation for the CMOS transistor 140.

Figure 6:
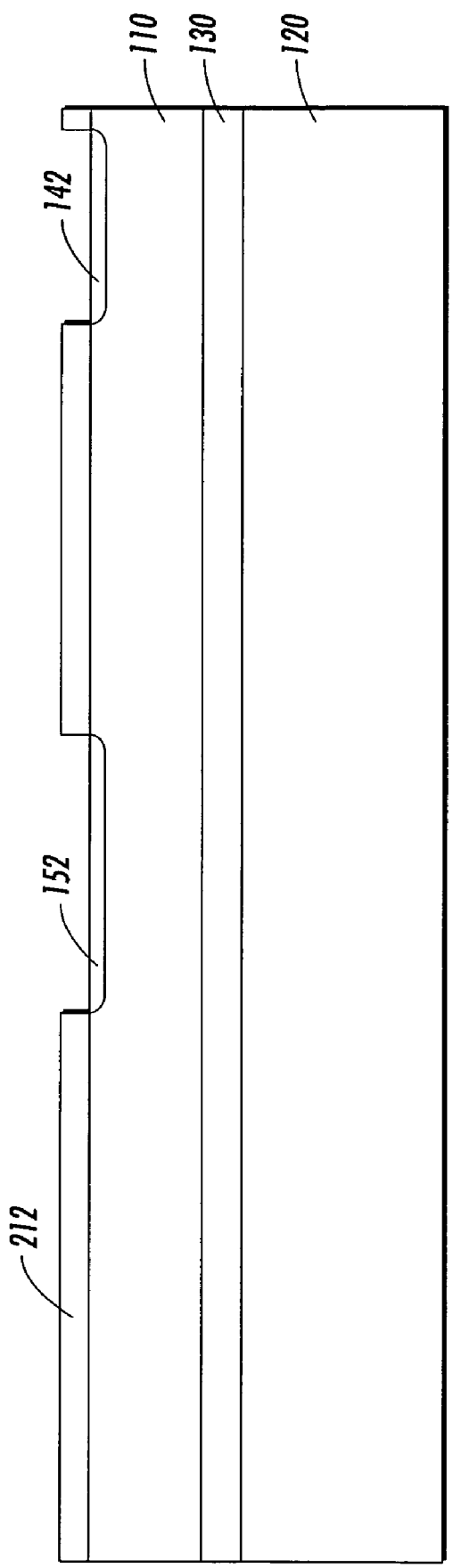
Figure 7:
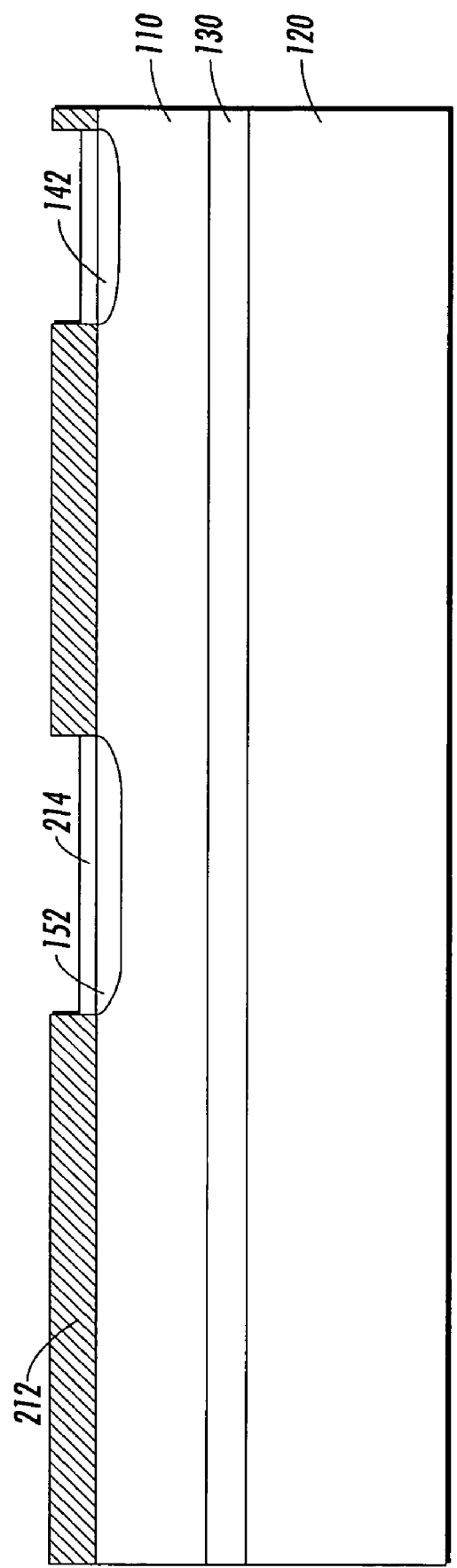

With the second mask 202 in place, a low voltage n-well 142 of the CMOS transistor 140 is ion implanted in the single-crystal-silicon layer 110. As shown in FIG. 6, the second mask 202 is then removed.

A thin layer of thermal oxide 214 is grown on the opening windows for high-voltage and low-voltage n-wells 152 and 142. This oxidation will create a step height difference between the n-well areas and the rest of the single-crystal-silicon layer 110 which is useful for alignment purpose in the subsequent processing steps. The thickness of oxide 214 can range from about 1500 angstroms to about 3000 angstroms.

Figure 8:
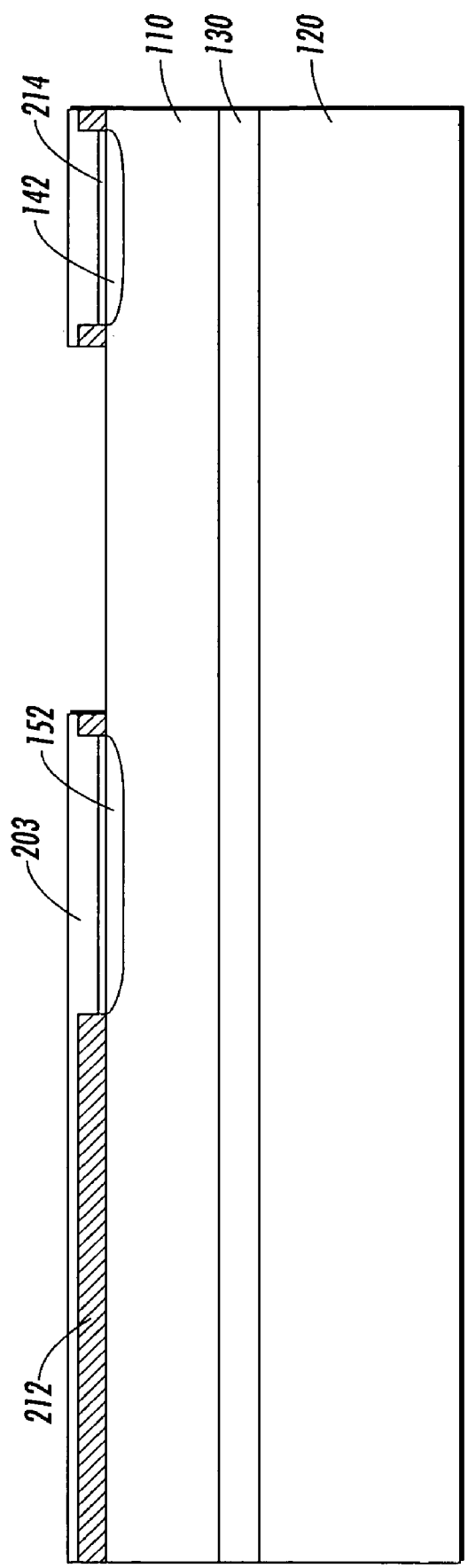

As shown in FIG. 8, a third mask 203 is formed over the protective oxide layers 214 and 212. Using the third mask 203, a portion of the first protective layer 212 is removed, for example, by etching.

Figure 9:
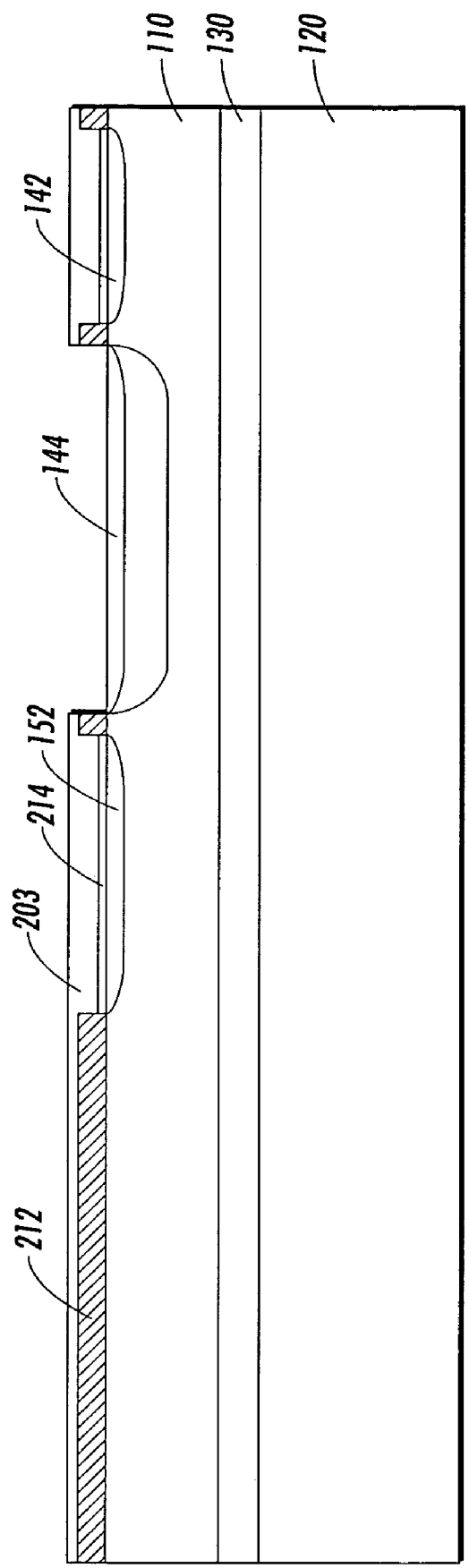
Figure 10:
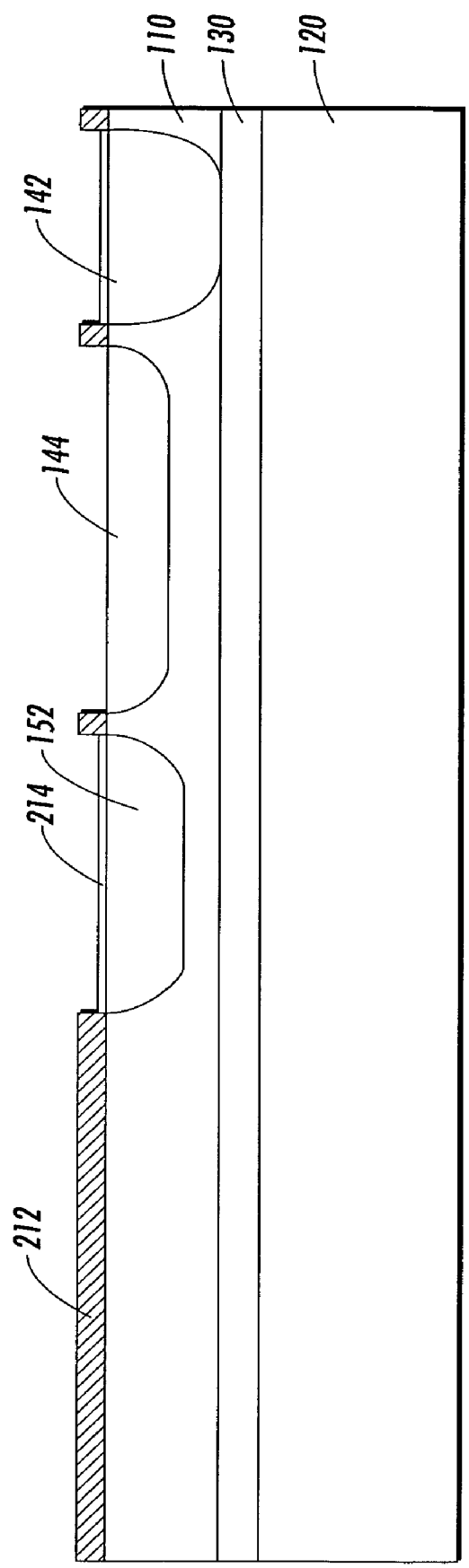

As shown in FIG. 9, with the third mask 203 in place, a low voltage p-well 144 of the CMOS transistor 140 is ion implanted in the single-crystal-silicon layer 110. As shown in FIG. 10, the third mask 203 is then removed.

A diffusion process may be used to drive in the p-well 144 and the n-wells 142 and 152. Then, the fist protective layer 212 along with the second protective layer 214 is removed.

Figure 11:
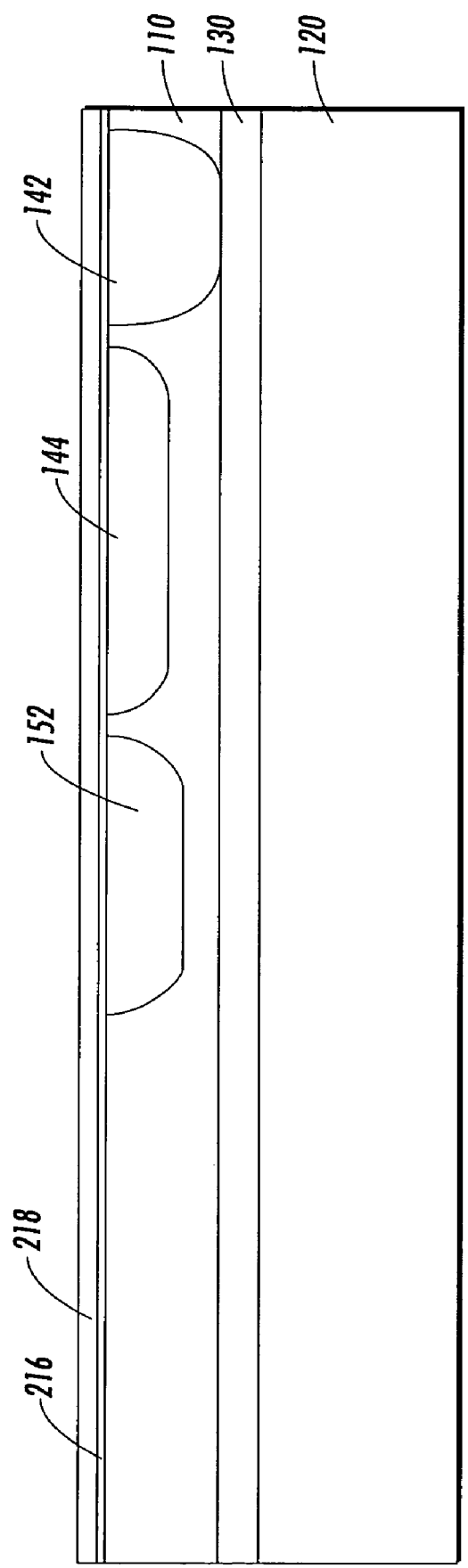

Next, an oxidation process is carried out. In particular, a local oxidation of silicon (LOCOS) process may be used. First, a pad oxide 216 is formed over the single-crystal-silicon layer 110, the p-well 144 and the n-wells 142 and 152, as shown in FIG. 11. The pad oxide 216 should have a thickness in the range of about 300 angstroms to about 700 angstroms. In particular, the pad oxide 216 may have a thickness of about 500 angstroms. Also, the pad oxide 216 should be grown in a temperature in a range of about 850-1000 degrees Celsius. In particular, the temperature may be about 900 degrees Celsius.

As shown in FIG. 11, a nitride layer 218 is deposited over the pad oxide 216. The nitride layer 218 may be deposited using any suitable technique, either known or hereafter developed, such as low pressure chemical vapor deposition (LPCVD). The nitride layer 218 should have a thickness in the range of about 1000 angstroms to about 1400 angstroms. In particular, the nitride layer 218 may have a thickness of about 1200 angstroms. Also, the nitride layer 218 should be deposited in a temperature in a range of about 450-900 degrees Celsius. In particular, the temperature may be about 820 degrees Celsius.

Figure 12:
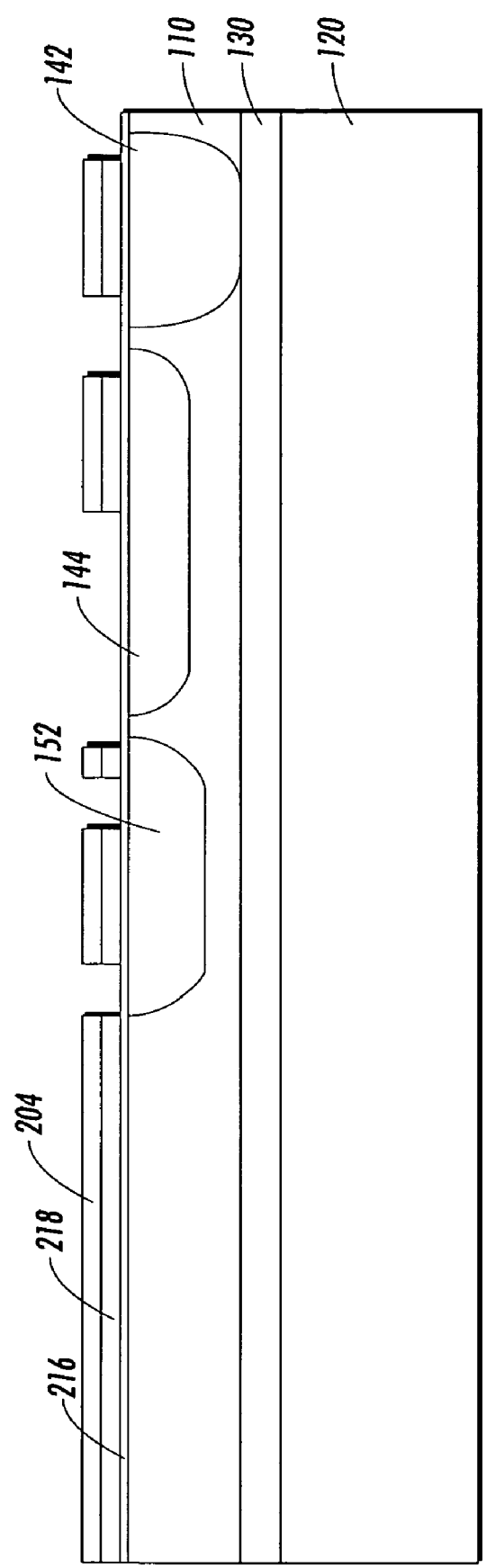
Figure 13:
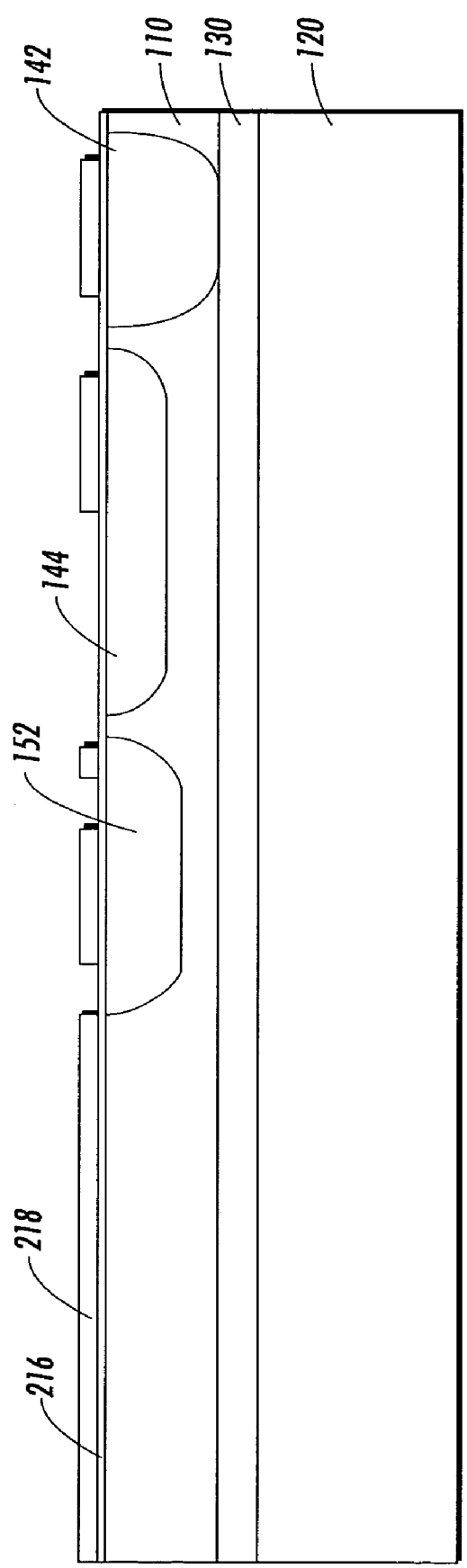

As shown in FIG. 12, a fourth mask 204 is formed over the nitride layer 218. Using the fourth mask 204, a portion of the nitride layer 218 is removed, for example, by etching. A reactive ion etch (RIE) is used to achieve a better dimension control on transistor devices. With the second mask 202 in place, a channel stop implantation is carried out. Then, as shown in FIG. 13, the fourth mask 204 is removed.

Figure 14:
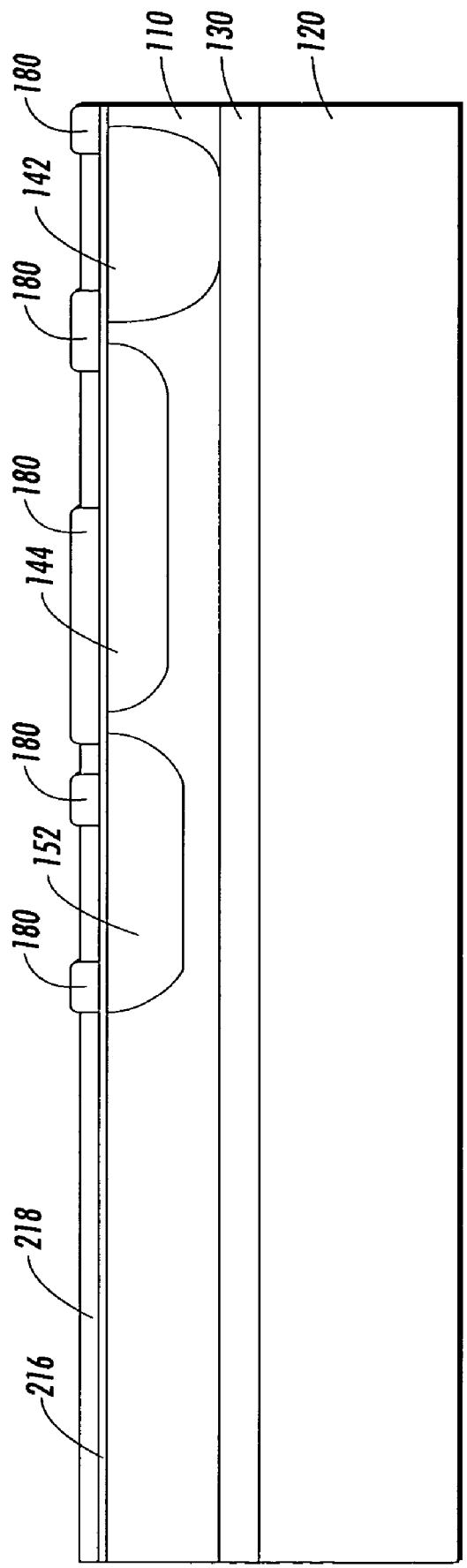

As shown in FIG. 14, the structure is subjected to a field oxidation to form a field oxide layer 180. The field oxide layer 180 should have a thickness greater than about 1.15 microns. Also, the field oxide layer 180 should be grown in a temperature in a range of about 950-1100 degrees Celsius. In particular, the temperature may be about 1000 degrees Celsius.

Figure 15:
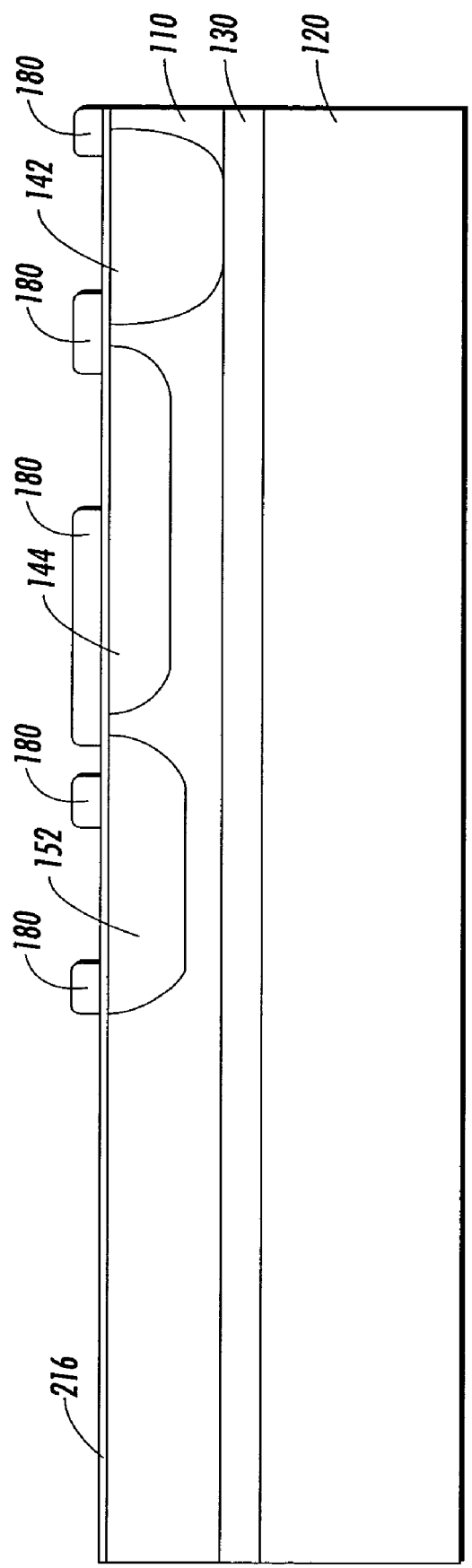
Figure 16:
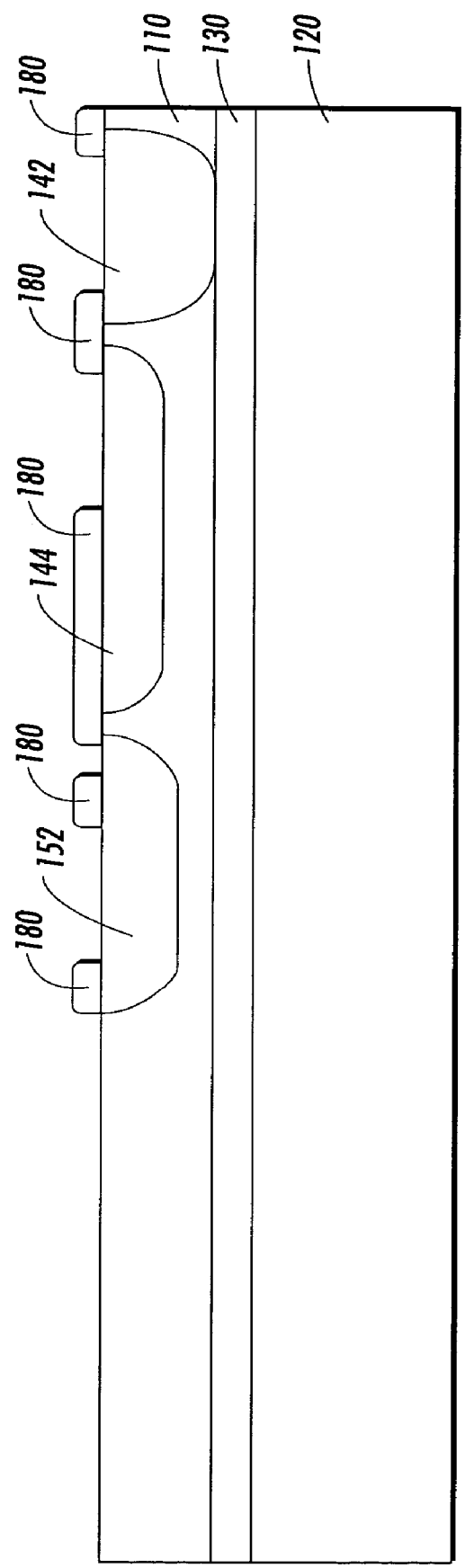
Figure 17:
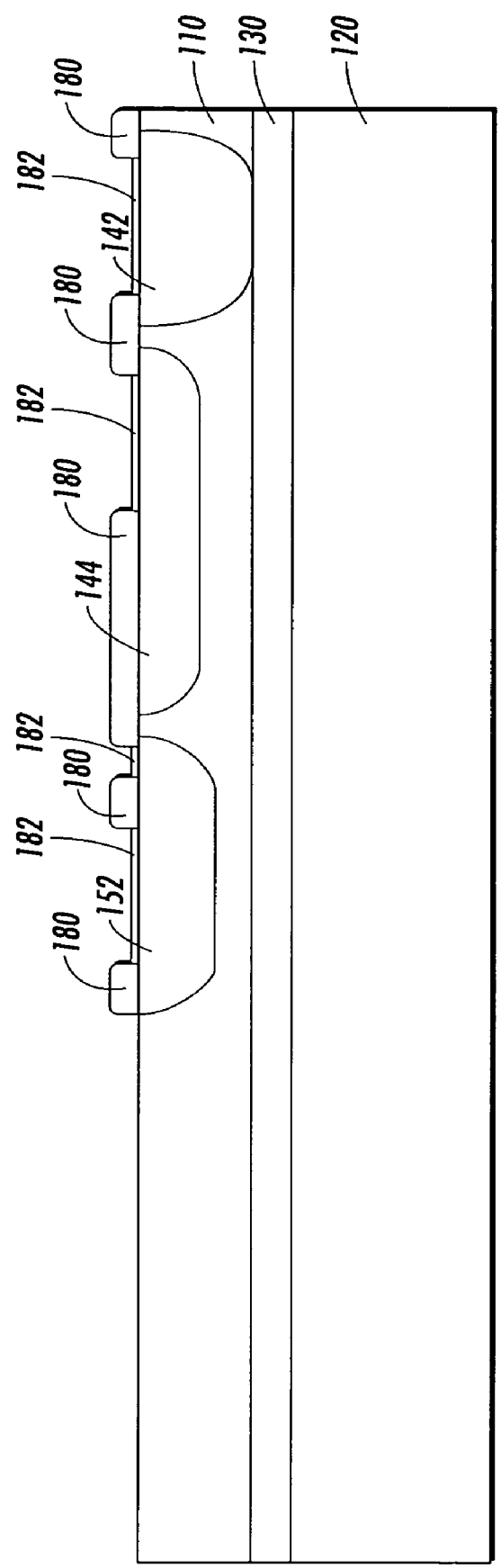

As shown in FIG. 15, the nitride layer 218 is removed, along with any oxide that may be on the nitride layer 218, using one or more wet etches. Then, as shown in FIG. 16, the pad oxide 216 is removed using a wet etch. A dry etch may damage (because of ion bombardment) active region of transistors and deteriorate transistor performance.

Although not shown in the Figs., according to the exemplary embodiment, a sacrificial oxide layer is provided as a protective layer for a blanket implantation (no mask) for threshold adjustment. The sacrificial oxide layer is stripped after the blanket implantation.

Next, a high quality gate oxide layer 182 is formed over the single-crystal-silicon layer 110 and the field oxide 180. The gate oxide layer 182 should have a thickness in a range of about 300 angstroms to about 400 angstroms. In particular, the gate oxide layer 182 may have a thickness of about 350 angstroms. Also, the gate oxide layer 182 should be grown in a temperature in a range of about 900-1000 degrees Celsius. In particular, the temperature may be about 950 degrees Celsius.

Figure 18:
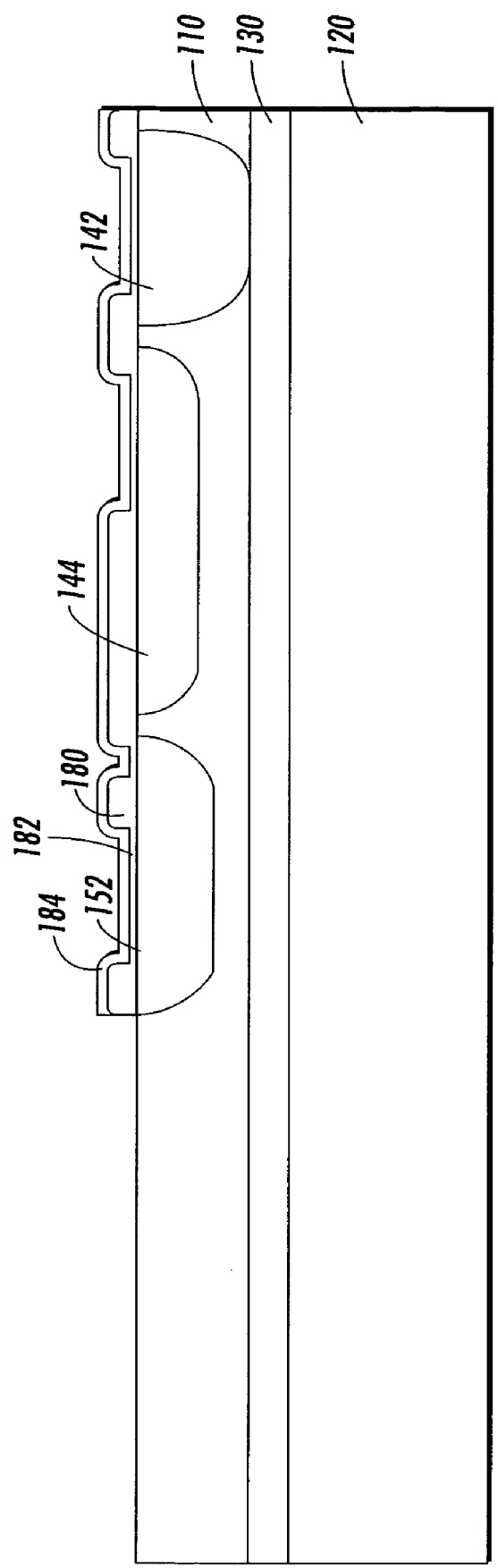

Next, as shown in FIG. 18, a polysilicon layer 184 is formed over the field oxide layer 180 and the gate oxide layer 182. The polysilicon layer 184 may be deposited using any suitable technique, such as chemical vapor deposition (CVD). The polysilicon layer 184 should have a thickness in a range of about 5000 angstroms to about 8000 angstroms. In particular, the polysilicon layer 184 may have a thickness of about 6000 angstroms. The polysilicon layer 184 is doped with a suitable n-type dopant, such as arsenic or phosphorus. A partial wet etch of surface oxide, known as deglazing, is then carried out.

Figure 19:
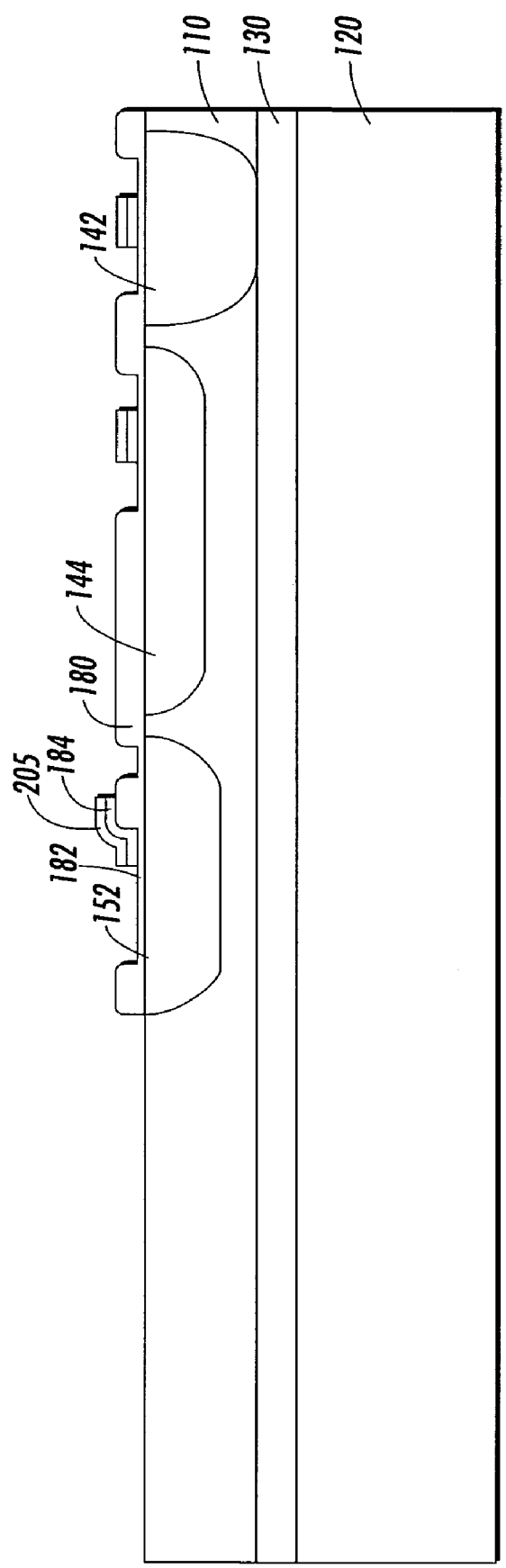
Figure 20:
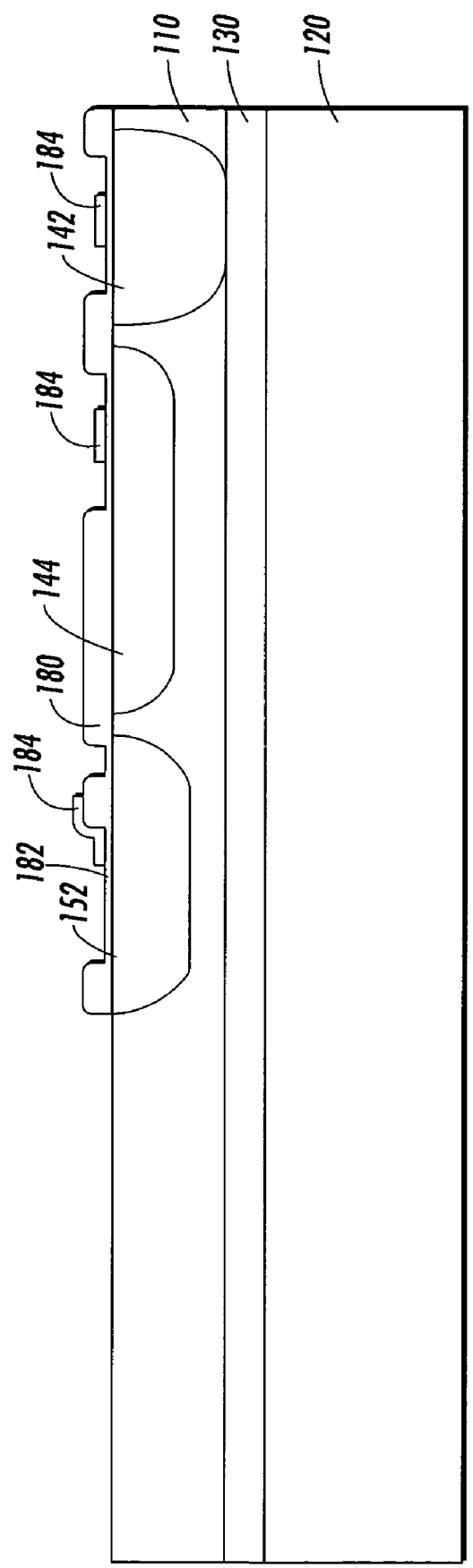

As shown in FIG. 19, a fifth mask 205 is formed over the polysilicon layer 184. Using the fifth mask 205, a portion of the polysilicon layer 184 is removed, for example, by etching, to obtain polysilicon gates and electrical interconnects for each of the high voltage n-well 152, the low voltage n-well 142 and the low voltage p-well 144. A reactive ion etch (RIE) should be used to avoid etching the gate oxide 182. Then, as shown in FIG. 20, the fifth mask 205 is removed.

Figure 21:
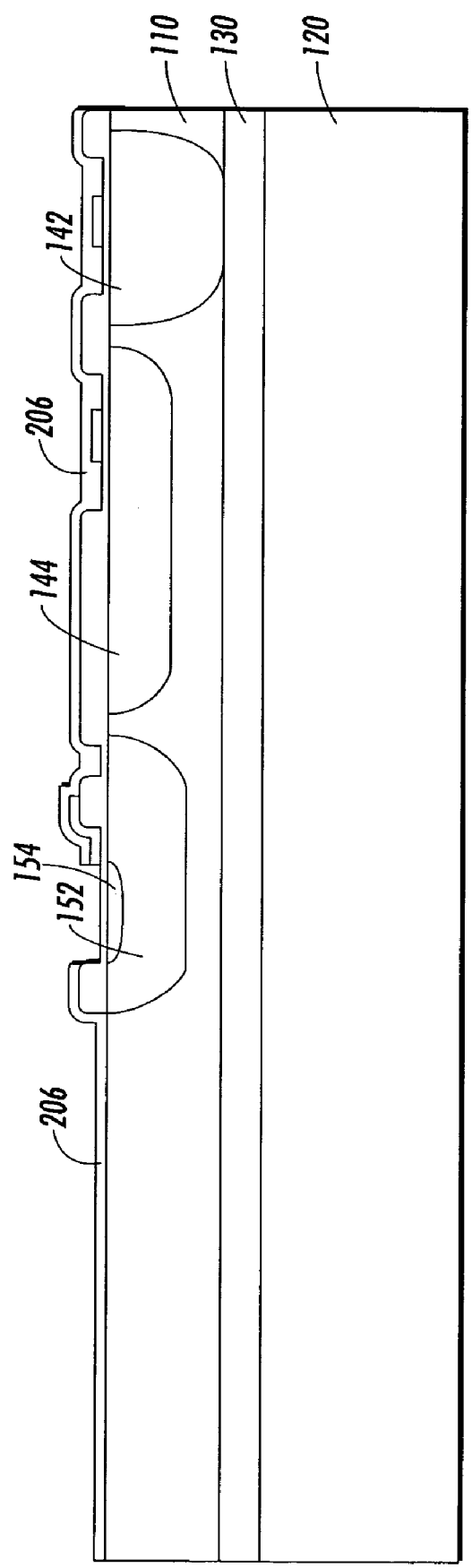
Figure 22:
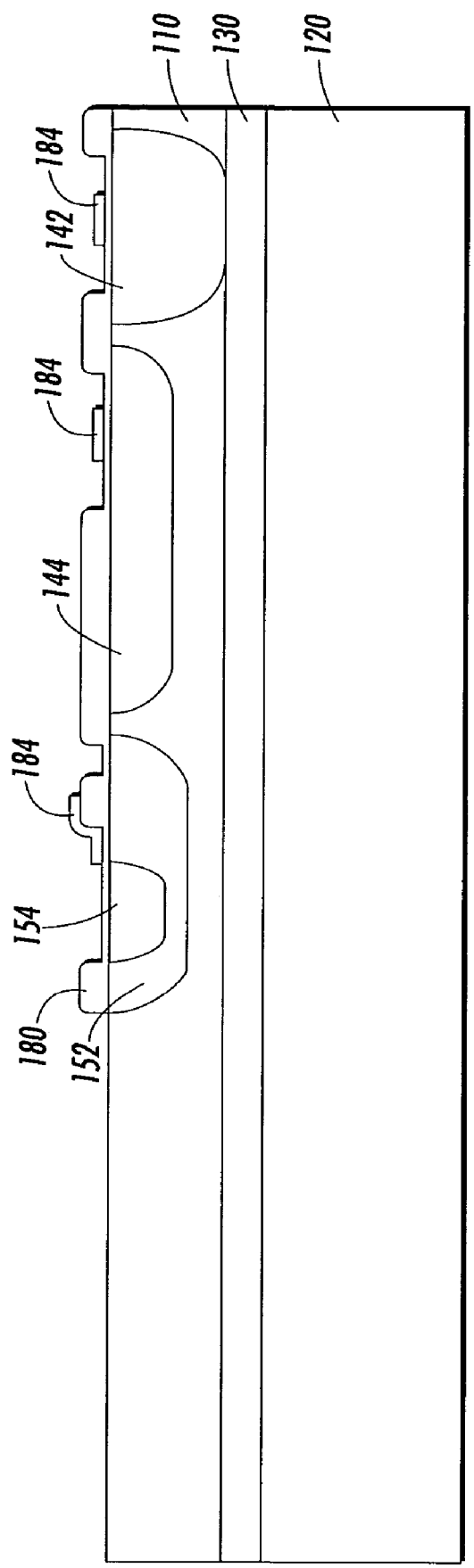

As shown in FIG. 21, a sixth mask 206 is formed over the field oxide layer 180 the polysilicon gates 184. Using the sixth mask 206, a P-body 154 is ion implanted in the high voltage n-well 152 of the DMOS transistor 150. Then, as shown in FIG. 22, the sixth mask 206 is removed. A high temperature process in inert gas is then applied to drive in the P-body 154.

Figure 23:
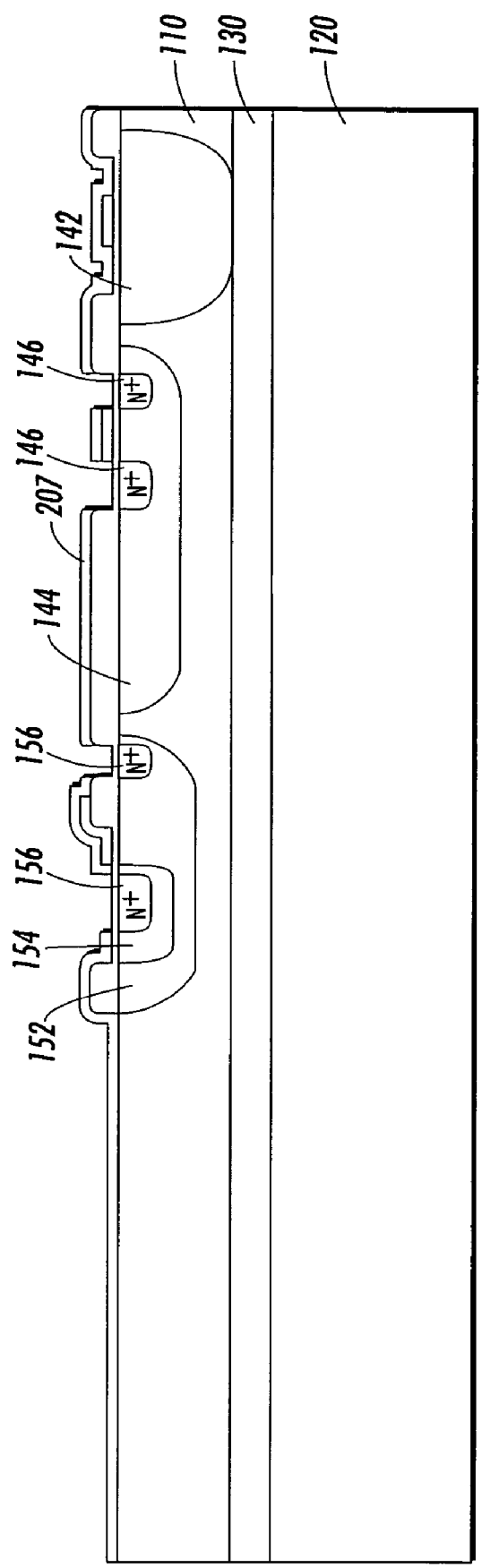
Figure 24:
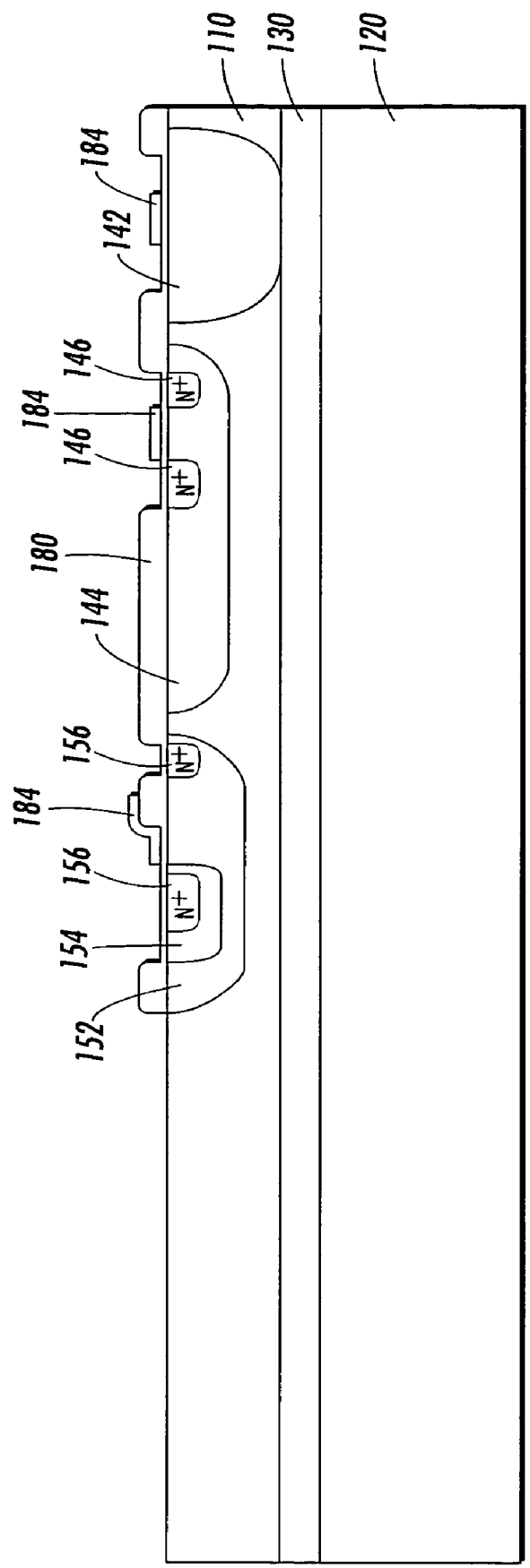

As shown in FIG. 23, a seventh mask 207 is formed over the field oxide layer 180 the polysilicon gates 184. Using the seventh mask 207, an N+ source/drain 156 is ion implanted in each of the P-body 154 and the high voltage n-well 152 of the DMOS transistor 150, and an N+ source/drain 146 is ion implanted in the low voltage p-well 144 of the CMOS transistor 140. Then, as shown in FIG. 24, the seventh mask 207 is removed.

Figure 25:
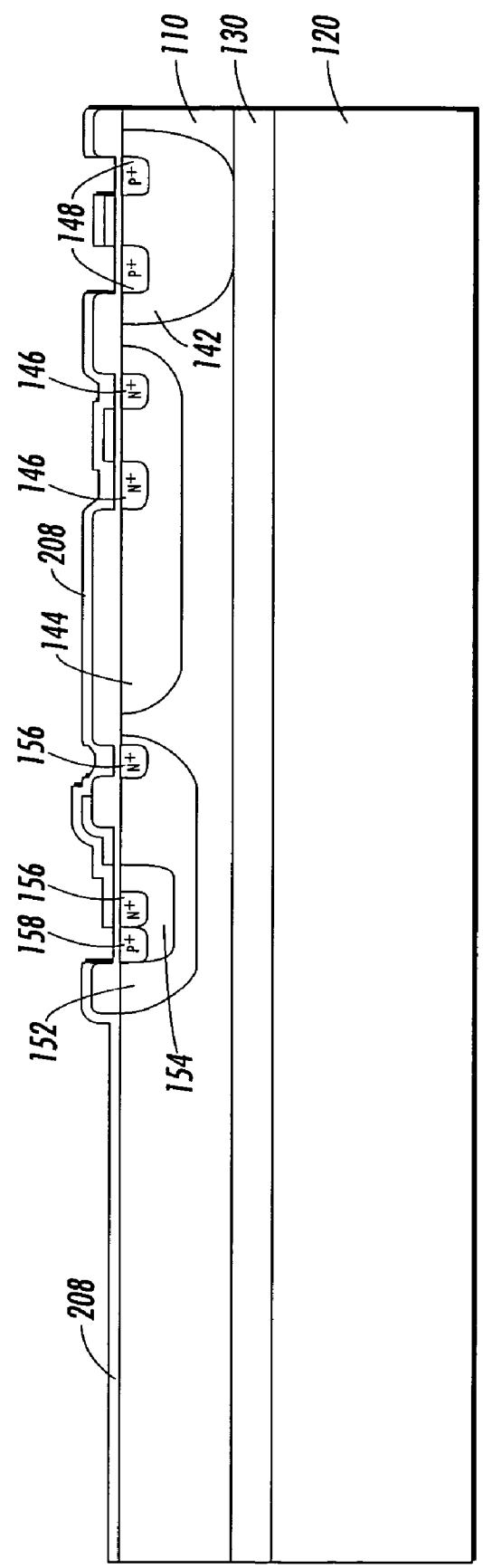
Figure 26:
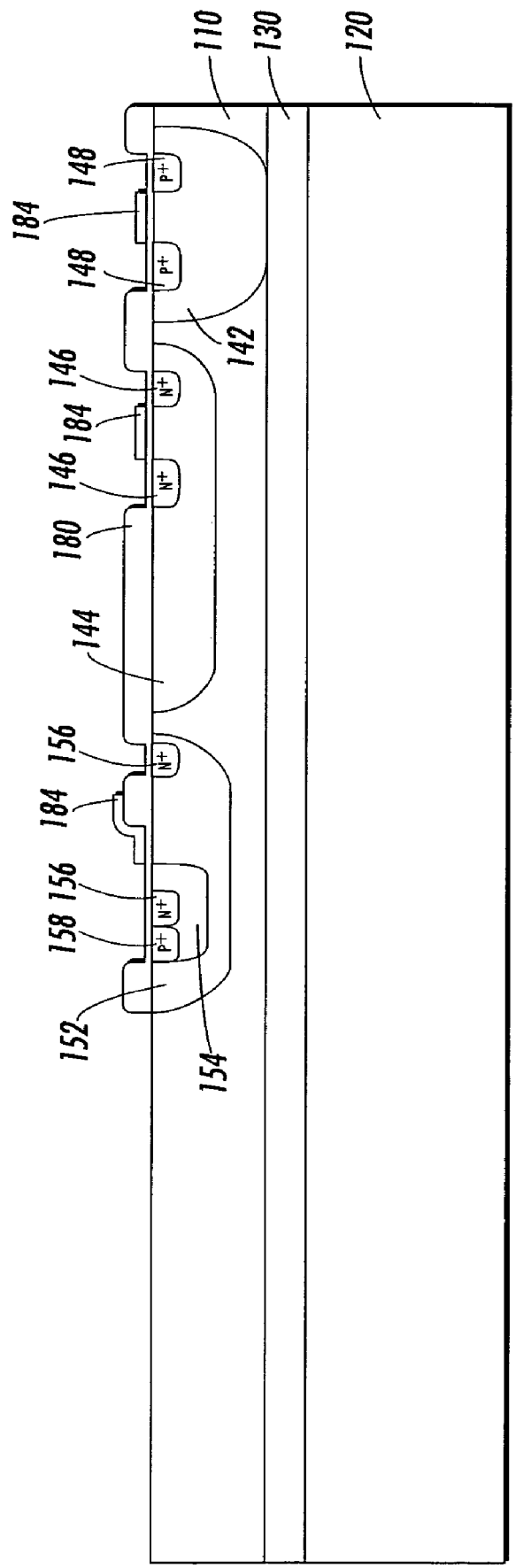

As shown in FIG. 25, an eighth mask 208 is formed over the field oxide layer 180 the polysilicon gates 184. Using the eighth mask 208, a P+ source/drain 158 is ion implanted in the P-body 154 of the DMOS transistor 150 and a P+ source/drain 148 is ion implanted in the low voltage n-well 144 of the CMOS transistor 140. Then, as shown in FIG. 26, the eighth mask 208 is removed.

Figure 27:
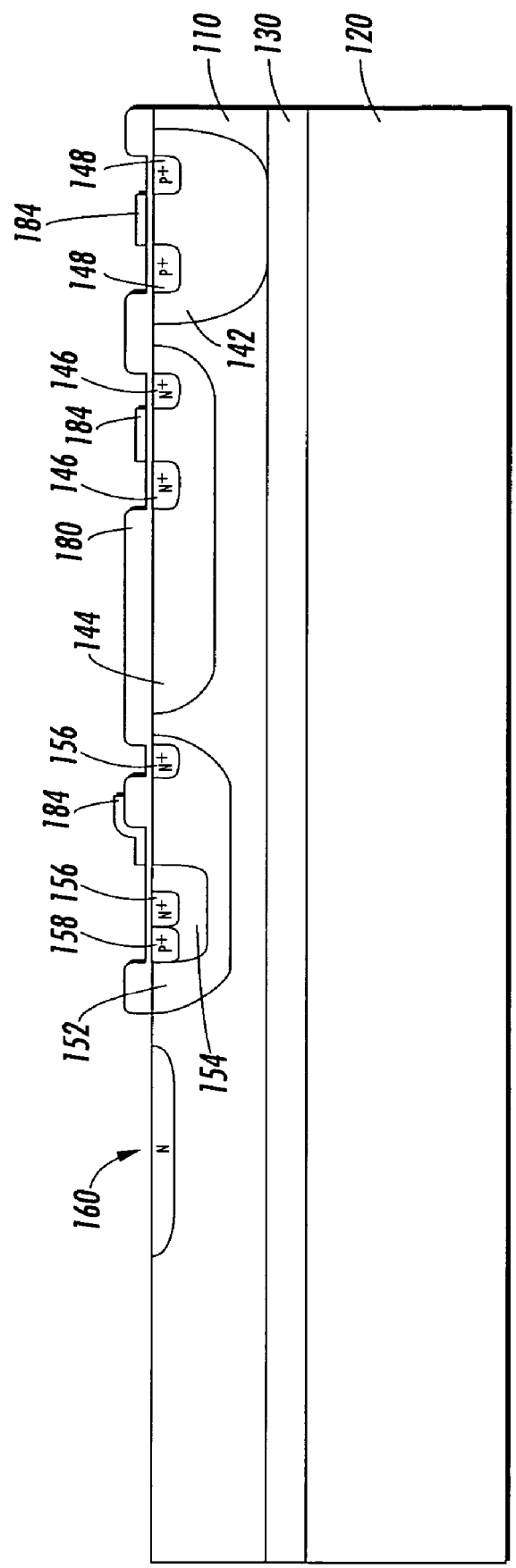

In a manner similar to that described above with respect to implantation of the N+ and P+ sources/drains 146, 156 and 148, 158, a desired p-n junction may be ion implanted in the single-crystal-silicon layer 110 to create the photodiode 160, as shown in FIG. 27. In particular, forming the photodiode 160 may include steps of ion implantation, annealing, and deposition of dielectrics.

Figure 28:
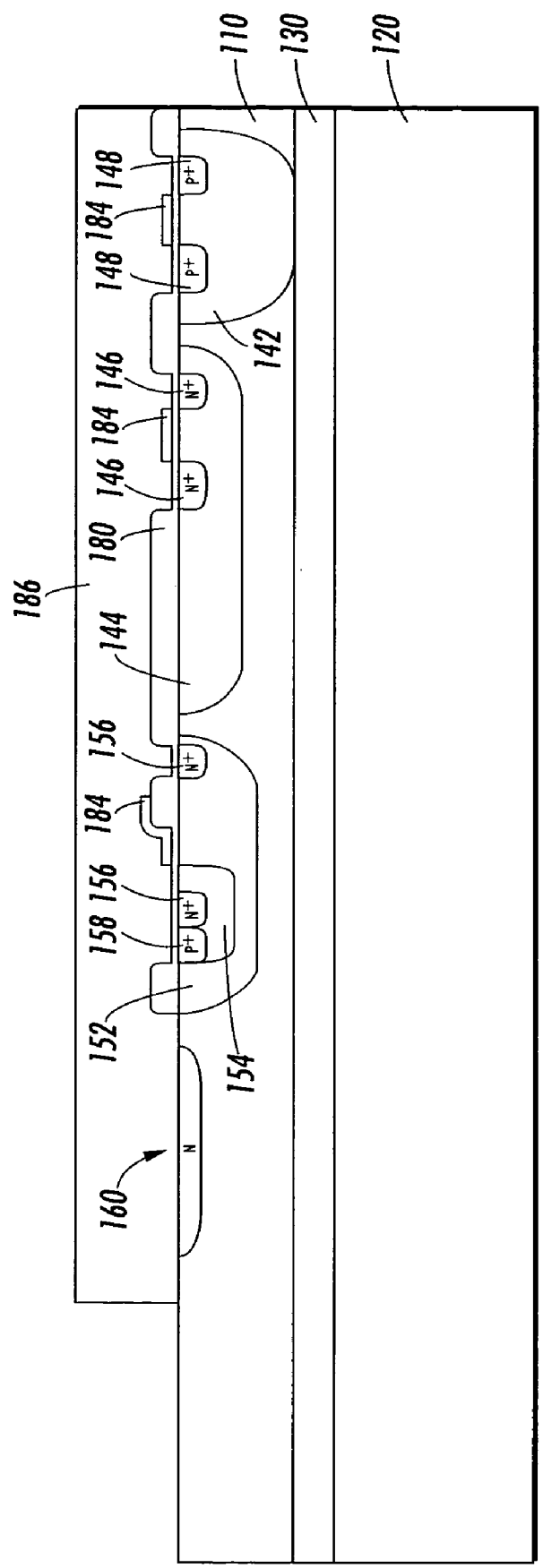

A passivation oxide layer 186 is formed over the CMOS transistor 140, the DMOS transistor 150 and the photodiode 160, as shown in FIG. 28. The passivation oxide layer 186 may be formed using any suitable technique, such as plasma enhanced chemical vapor deposition (PECVD). The passivation oxide layer 186 should have a thickness of greater than about 4500 angstroms. In particular, the passivation oxide layer 186 may have a thickness of about 5000 angstroms. The passivation oxide layer 186 is annealed in an inert gas, for example, at about 900 degrees Celsius.

Figure 29:
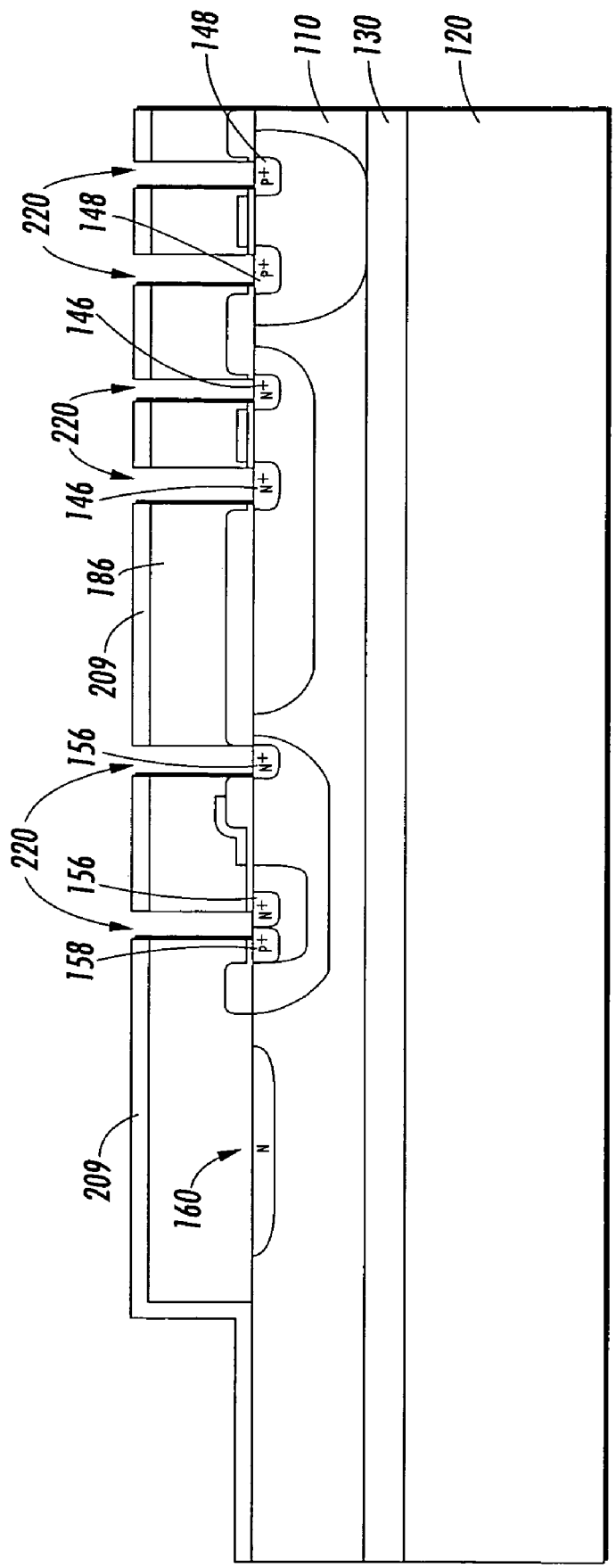
Figure 30:
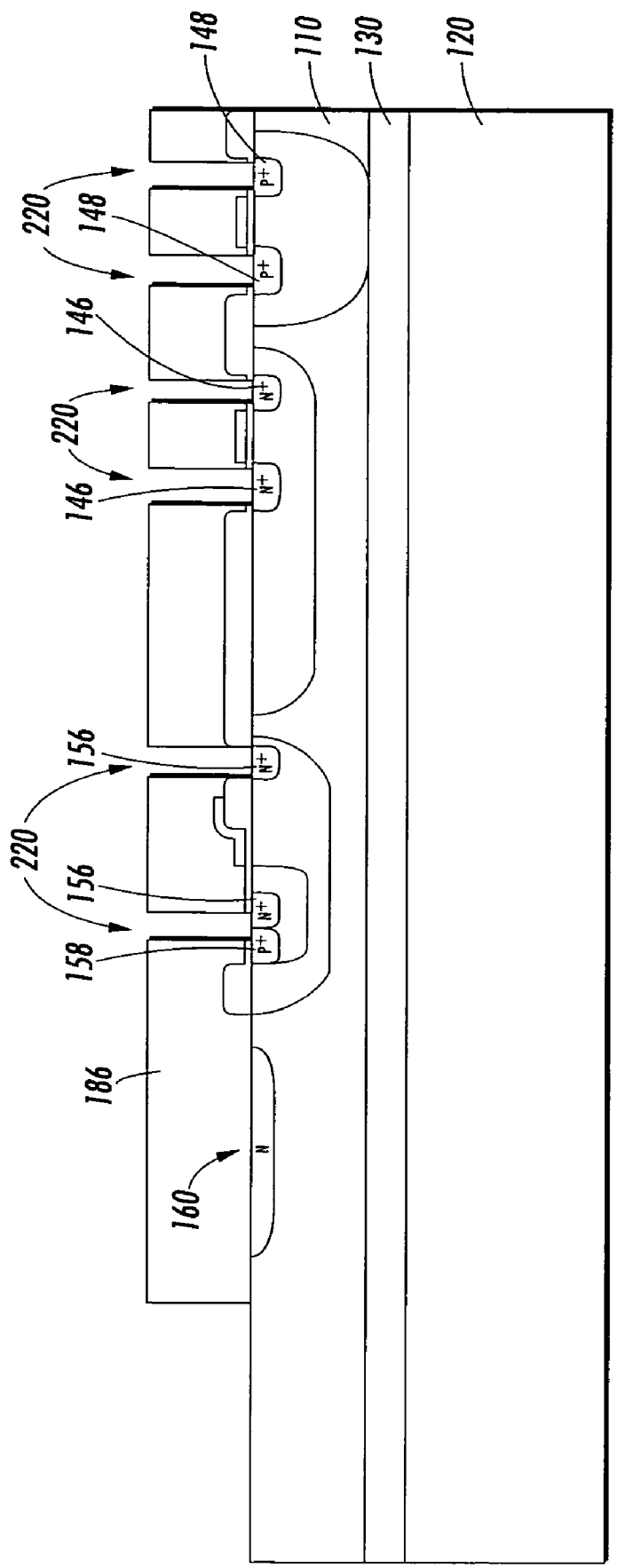

As shown in FIG. 29, a ninth mask 209 is formed over the passivation oxide layer 186. Using the ninth mask 209, a plurality of vias 220 are formed through the passivation oxide layer 186 to the N+ and P+ sources/drains 146, 156 and 148, 158. Any suitable technique may be used to form the vias 220, such as a reactive ion etch (RIE) and/or a hydrofluoric acid etch. As shown in FIG. 30, the ninth mask 209 is then removed.

Figure 31:
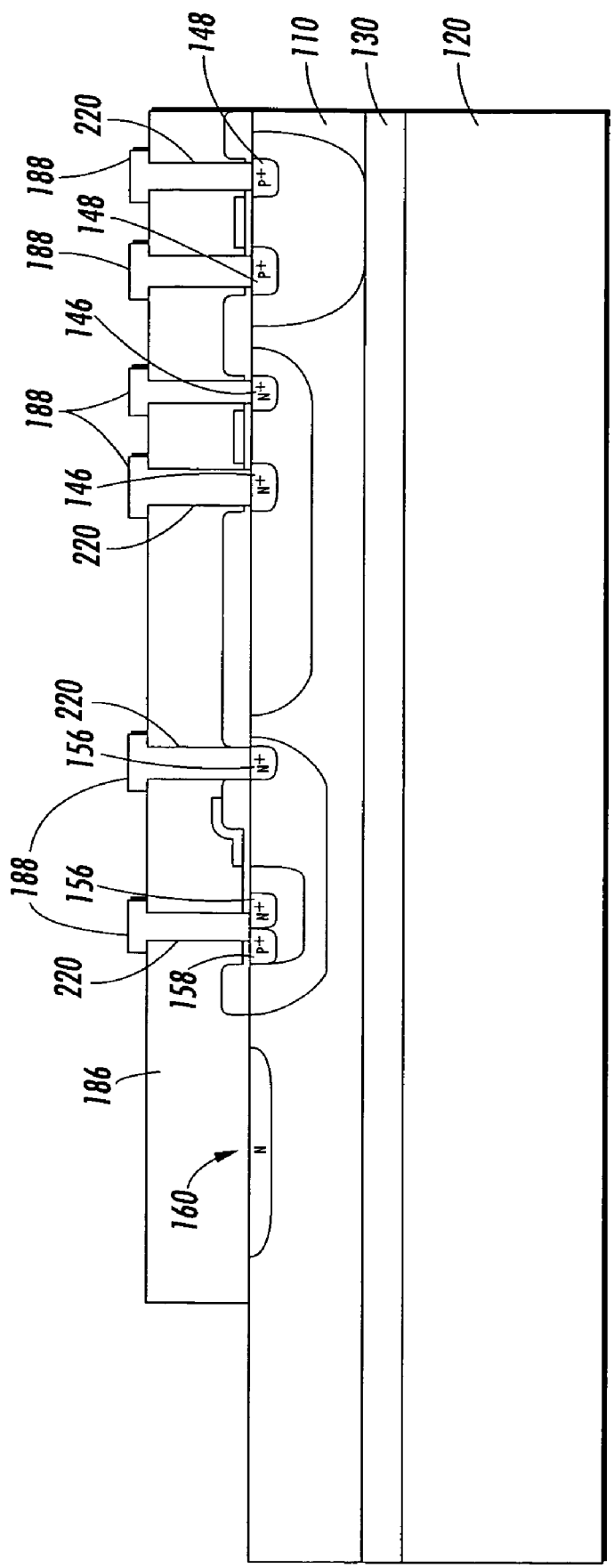

Then, a metal layer 188, for example, aluminum, is formed over the passivation oxide layer 186 and in the vias 220. The metal layer may be formed by any suitable technique, either known or hereafter developed, such as sputtering. As shown in FIG. 31, the metal layer 188 is partially removed using a tenth mask (not shown) and any suitable technique, such as etching. The tenth mask is removed by any suitable stripping technique.

Any suitable approach for improving metal-semiconductor contacts may be employed. For example, a pre-alloy cleaning in hot acetone and isopropyl alcohol followed by a sintering step may be used.

Finally, any suitable techniques for forming electrical, mechanical, electromechanical or other elements of microelectromechanical system-based devices may be used to define the at least one microelectromechanical system-based element 170. For example, the element 170 may be a movable mechanical element that is photolithographically defined and then released via a release etch to obtain the heterogeneous device shown in FIG. 32.

While this invention has been described in conjunction with various exemplary embodiments, it is to be understood that many alternatives, modifications and variations would be apparent to those skilled in the art. Accordingly, Applicants intend to embrace all such alternatives, modifications and variations that follow in the spirit and scope of this invention.

For example, it should be understood that the design and configuration of the device are illustrative and not limiting. The methods of this invention may be used to fabricate various devices in which heterogeneous devices are combined. For example, the methods of this invention may be used to fabricate various micro-optoelectromechanical (MOEM) devices for telecommunications and other applications.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A fabrication method for a heterogeneous device, comprising:
   providing a substrate; and
   successively masking, ion implanting, oxidizing, thin film depositing and annealing the substrate to define a plurality of heterogeneous circuit devices in the substrate,
   wherein the plurality of heterogeneous circuit devices include at least one CMOS transistor and at least one DMOS transistor and at least one microelectromechanical system-based element in the substrate.

2. The method of claim 1, wherein masking the substrate comprises:
   forming a protective layer; and
   removing a portion of the protective layer.

3. The method of claim 1, wherein ion implanting the substrate to define a plurality of heterogeneous circuit devices in the substrate comprises ion implanting and annealing at least one photodiode.

4. The method of claim 1, wherein ion implanting the substrate to define a plurality of heterogeneous circuit devices in the substrate comprises ion implanting at least one complementary metal oxide semiconductor transistor and at least one double-diffused metal oxide semiconductor transistor.

5. The method of claim 4, wherein ion implanting the substrate to define a plurality of heterogeneous circuit devices in the substrate further comprises ion implanting and annealing at least one photodiode.

6. The method of claim 4, wherein providing a substrate comprises providing a layer of silicon.

7. The method of claim 6, wherein providing a layer of silicon comprises providing a layer of p-type silicon.

8. The method of claim 1, wherein providing a substrate comprises providing a silicon-on-insulator wafer comprising a single-crystal-silicon layer, a substrate and an insulator layer therebetween.

9. The method of claim 8, wherein providing a silicon-on-insulator wafer comprises providing a silicon-on-insulator wafer comprising a p-type silicon layer, a substrate and an insulator layer therebetween.

* * * * *

UNITED STATES PATENT AND TRADEMARK OFFICE
CERTIFICATE OF CORRECTION

| | | |
|---|---|---|
| PATENT NO. | : 7,341,930 B2 | Page 1 of 1 |
| APPLICATION NO. | : 10/990711 | |
| DATED | : March 11, 2008 | |
| INVENTOR(S) | : Jingkuang Chen et al. | |

It is certified that error appears in the above-identified patent and that said Letters Patent is hereby corrected as shown below:

In the Specification

Col. 1, between lines 13 and 14, insert the following new paragraph:

--This invention was made with Government support under 70NANB8H4014 awarded by NIST. The Government has certain rights in this invention.--

Signed and Sealed this
Eighteenth Day of March, 2014

Michelle K. Lee
*Deputy Director of the United States Patent and Trademark Office*